US010281941B2

(12) United States Patent
Mori et al.

(10) Patent No.: US 10,281,941 B2
(45) Date of Patent: May 7, 2019

(54) VOLTAGE GENERATING CIRCUIT AND OVERCURRENT DETECTING CIRCUIT

(71) Applicant: FUJI ELECTRIC CO., LTD., Kawasaki-shi, Kanagawa (JP)

(72) Inventors: Takahiro Mori, Matsumoto (JP); Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/830,830

(22) Filed: Dec. 4, 2017

(65) Prior Publication Data

US 2018/0088615 A1   Mar. 29, 2018

Related U.S. Application Data

(63) Continuation of application No. PCT/JP2016/083022, filed on Nov. 8, 2016.

(30) Foreign Application Priority Data

Dec. 7, 2015   (JP) ................. 2015-238936

(51) Int. Cl.
   *G05F 1/575*      (2006.01)
   *H02M 1/00*       (2006.01)
   *H03K 17/60*      (2006.01)

(52) U.S. Cl.
   CPC ............. *G05F 1/575* (2013.01); *H02M 1/00* (2013.01); *H03K 17/60* (2013.01); *H03K 2217/0063* (2013.01); *H03K 2217/0072* (2013.01)

(58) Field of Classification Search
   CPC ............. G05F 1/575; H03K 17/60; H03K 2217/0063; H03K 2217/0072; H02M 1/00
   (Continued)

(56) References Cited

U.S. PATENT DOCUMENTS 4,352,053 A * 9/1982 Oguchi ................. G05F 1/463
                                          323/220
4,623,798 A * 11/1986 Arai ..................... G01K 3/005
                                          307/117

(Continued)

FOREIGN PATENT DOCUMENTS

JP      2002-112535      4/2002
JP      2004-45305       2/2004

(Continued)

OTHER PUBLICATIONS

Received STIC search reports (3) from EIC 2800 searcher Benjamin Martin on Apr. 3, 2018 for claims 1, 9 and 12.*

(Continued)

*Primary Examiner* — Timothy J. Dole
*Assistant Examiner* — Htet Z Kyaw (57) ABSTRACT

A voltage generating circuit includes a first resistance voltage dividing circuit, configured by low temperature coefficient resistors being connected in series, that generates a reference voltage by resistance-dividing a predetermined power supply voltage, one or a multiple of a second resistance voltage dividing circuit, configured by a resistor having a positive or negative resistance temperature coefficient and the low temperature coefficient resistor being connected in series, that generates a temperature-dependent divided voltage by resistance-dividing the power supply voltage, and an instrumentation amplifier that generates the comparison reference voltage in accordance with a difference between the reference voltage and the divided voltage. The voltage generating circuit includes a comparator that, when a divided voltage exceeds a predetermined voltage threshold in accompaniment to a temperature rise, changes the divided voltage generated by the second resistance (Continued)

voltage dividing circuit and applied to the instrumentation amplifier, or changes a gain of the instrumentation amplifier.

11 Claims, 8 Drawing Sheets

(58) Field of Classification Search
USPC .......................................................... 323/274
See application file for complete search history.

(56) References Cited

U.S. PATENT DOCUMENTS

| | | | | |
|---|---|---|---|---|
| 5,772,321 | A * | 6/1998 | Rhodes | G01N 27/185 374/44 |
| 5,795,069 | A * | 8/1998 | Mattes | G01K 7/21 327/513 |
| 6,236,320 | B1 * | 5/2001 | Senba | G01K 7/24 340/584 |
| 6,678,180 | B2 * | 1/2004 | Matsuda | H02M 1/38 318/810 |
| 6,717,457 | B2 * | 4/2004 | Nanba | G01K 7/24 327/513 |
| 6,946,848 | B2 * | 9/2005 | Tauber | G01R 35/007 324/601 |
| 7,481,574 | B2 * | 1/2009 | Ariyoshi | G01F 1/6845 374/11 |
| 7,642,620 | B2 * | 1/2010 | Tanaka | G01J 5/24 257/536 |
| 8,337,082 | B2 * | 12/2012 | Coursey | G01K 7/20 374/185 |
| 8,644,038 | B2 * | 2/2014 | Sasaki | G01R 19/0092 361/93.2 |
| 8,689,608 | B2 * | 4/2014 | Nakano | G01N 25/18 73/25.03 |
| 8,794,831 | B2 * | 8/2014 | Coursey | G01K 7/20 374/185 |
| 9,608,609 | B2 * | 3/2017 | Wasekura | H05K 999/99 |
| 9,762,117 | B2 * | 9/2017 | Sasaki | H02M 1/32 |
| 9,780,660 | B2 * | 10/2017 | Hashimoto | H02M 1/32 |
| 9,939,336 | B2 * | 4/2018 | Coursey | G01K 19/00 |
| 2002/0057125 | A1 | 5/2002 | Demizu | |
| 2003/0226082 | A1 * | 12/2003 | Kim | G06K 19/073 714/734 |
| 2005/0007167 | A1 * | 1/2005 | Tange | H02H 9/001 327/172 |
| 2006/0113969 | A1 * | 6/2006 | Hatanaka | G01R 19/16571 323/212 |
| 2009/0057832 | A1 * | 3/2009 | Kouno | H01L 29/7397 257/577 |
| 2010/0285571 | A1 * | 11/2010 | Coursey | G01K 7/20 435/286.1 |
| 2010/0302050 | A1 * | 12/2010 | Kang | H01M 10/465 340/636.2 |
| 2011/0181361 | A1 * | 7/2011 | Nolan | H03F 1/30 330/278 |
| 2013/0285207 | A1 * | 10/2013 | Maeda | H01L 28/20 257/538 |
| 2015/0127288 | A1 * | 5/2015 | Coursey | G01K 7/20 702/99 |
| 2015/0309090 | A1 | 10/2015 | Akahane | |
| 2015/0346245 | A1 * | 12/2015 | Kiep | H02M 1/08 323/271 |
| 2015/0348385 | A1 * | 12/2015 | Lamb | G08B 13/08 340/547 |
| 2017/0211984 | A1 * | 7/2017 | Simolon | G01J 5/24 |

FOREIGN PATENT DOCUMENTS

JP    2014057404    * 3/2014
WO   WO 2014/199816 A1   12/2014

OTHER PUBLICATIONS

International Search Report dated Dec. 6, 2016 in corresponding International Patent Application No. PCT/JP2016/083022.

* cited by examiner

VOLTAGE GENERATING CIRCUIT AND OVERCURRENT DETECTING CIRCUIT

CROSS-REFERENCE TO RELATED APPLICATIONS

This application is a continuation application, under 35 U.S.C. § 111(a) of international patent application No. PCT/JP2016/083022, filed Nov. 8, 2016, which claims foreign priority to Japanese patent application No. 2015-238936, filed Dec. 7, 2015, the entire disclosures of which are herein incorporated by reference as a part of this application.

BACKGROUND

1. Field

The present application relates to a voltage generating circuit that, after carrying out, for example, an overcurrent detection, can generate a comparison reference voltage at a high accuracy in accordance with output temperature characteristics of a current detecting element, and to an overcurrent detecting circuit that includes the voltage generating circuit.

2. Description of the Related Art

As a power supply device that drives an alternating current load such as a motor, there is a power converter wherein a half-bridge circuit is formed by, for example, first and second switching elements being connected in series. The first and second switching elements are formed of a high-breakdown voltage IGBT or MOSFET, are alternately driven on and off by a drive control circuit realized as a power supply IC, and supply alternating current power to a load connected to an intermediate point of the half-bridge circuit.

An overcurrent detecting circuit, which detects an overcurrent flowing into a switching element and causes the driving on of the switching element to stop, is provided in the drive control circuit. The overcurrent detecting circuit is configured to include, for example, current detecting resistance, which generates a voltage proportional to current flowing into a switching element based on an output of a current detecting element integrally incorporated in the switching element, and a comparator that detects an overcurrent of a switching element by comparing voltage detected via the current detecting resistance and a predetermined comparison reference voltage.

In this case, it is important that the comparison reference voltage is generated with consideration to output temperature characteristics of the current detecting element in order to prevent an erroneous overcurrent detection. The comparison reference voltage is generated by a resistance dividing circuit that simply resistance-divides a predetermined power supply voltage. A related art technology is such that the power supply voltage is applied to the resistance dividing circuit via a bipolar transistor, and utilizing temperature characteristics of the bipolar transistor, the comparison reference voltage is provided with temperature characteristics corresponding to output temperature characteristics of the current detecting element, as introduced in, for example, PTL 1.

A drive control circuit that drives a high side switching element on and off is configured so as to carry out a floating action with an intermediate point voltage of the half-bridge circuit as a reference potential. Therefore, it cannot be denied that a displacement current flows into the high side drive control circuit in accompaniment to an on/off action of the high side switching element in a hybrid circuit. Therefore, the intermediate point potential of the half-bridge circuit on which the floating action is referenced fluctuates due to the displacement current, and the reference potential of the high side drive control circuit, and by extension the power supply voltage, fluctuates.

Also, a displacement current caused by a negative voltage surge accompanying an on/off action of a switching element, and a forward current caused by a forward bias of a parasitic diode in a semiconductor circuit substrate forming the drive control circuit, are also liable to occur in the high side drive control circuit. Therefore, it cannot be denied either that the bipolar transistor malfunctions due to potential fluctuation and displacement current, due to which the comparison reference voltage fluctuates.

Therefore, the inventor et al configure, in place of the bipolar transistor, first and second resistance voltage dividing circuits that generate divided voltages having positive and negative temperature gradients respectively by a low temperature coefficient resistor (LTC), whose temperature coefficient can be taken to be zero (0), and a resistor having a negative temperature coefficient of resistance (HR) being connected in series, as previously disclosed in PTL 2. Further, the inventor et al propose using an instrumentation amplifier to generate a comparison reference voltage having temperature characteristics corresponding to output temperature characteristics of a current detecting element in accordance with a difference between the divided voltages generated by the resistance voltage dividing circuits.

CITATION LIST

Patent Literature

PTL 1: JP-A-2004-45305
PTL 2: WO 2014/199816

SUMMARY

Herein, the temperature gradient of an output current of a current sensing IGBT acting as a current detecting element integrally incorporated in, for example, an IGBT, which is a switching element, can generally be taken to be approximately constant. Strictly speaking, however, the output current temperature gradient of the current sensing IGBT increases slightly as an operating temperature of the IGBT increases. Consequently, in order to carry out overcurrent detection with greater accuracy, it is important to generate a comparison reference voltage in accordance with non-linear temperature characteristics of the current sensing IGBT output current, that is, with the output temperature characteristics of the current detecting element.

The embodiments, having been contrived with consideration to this kind of situation, have an object of providing a voltage generating circuit that can easily and with high accuracy generate a comparison reference voltage having temperature characteristics that more accurately change in accordance with output temperature characteristics of a current detecting element, and a highly accurate overcurrent detecting circuit configured using the voltage generating circuit.

In order to achieve the heretofore described object, a voltage generating circuit according to an embodiment generates a comparison reference voltage having temperature characteristics proportional to output temperature characteristics of a current detecting element by resistance-dividing a predetermined power supply voltage, the voltage generating circuit including a first resistance voltage dividing circuit, configured by low temperature coefficient resistors whose resistance temperature coefficient can basically be taken to be zero (0) being connected in series, that generates a reference voltage by resistance-dividing the power supply voltage, one or a multiple of a second resistance voltage dividing circuit, configured by a resistor having a positive or negative resistance temperature coefficient and the low temperature coefficient resistor being connected in series, that generates a temperature-dependent divided voltage by resistance-dividing the power supply voltage, and an instrumentation amplifier that generates the comparison reference voltage in accordance with a difference between the reference voltage and the divided voltage.

In particular, the voltage generating circuit according to the embodiment is characterized by including a comparator that, when the divided voltage exceeds a predetermined voltage threshold in accompaniment to a temperature rise, changes the divided voltage generated by the second resistance voltage dividing circuit and applied to the instrumentation amplifier, or changes a gain of the instrumentation amplifier, and by being configured so as to change a temperature gradient of the comparison reference voltage with an operating point of the comparator as a boundary.

Also, an overcurrent detecting circuit according to the embodiment is characterized by including an overcurrent detecting comparator that compares the comparison reference voltage generated by the voltage generating circuit and a voltage detected via the current detecting element, and detects an overcurrent flowing into the switching element.

According to a voltage generating circuit with this kind of configuration, a temperature gradient of a comparison reference voltage is changed using an output of a comparator, because of which temperature characteristics of the comparison reference voltage can be accurately adjusted to output temperature characteristics of a current detecting element easily and effectively. In particular, a comparison reference voltage with temperature characteristics that approximate non-linear output temperature characteristics of the current detecting element can be generated simply by changing a temperature gradient of a divided voltage applied from a second resistance voltage dividing circuit to an instrumentation amplifier in accordance with the output of the comparator, or by changing a gain of the instrumentation amplifier.

Therefore, even when detecting a current flowing into, for example, a high side IGBT via a current sensing IGBT, a comparison reference voltage that forms a reference for overcurrent detection can be accurately generated regardless of an IGBT displacement current, fluctuation of a half-bridge circuit intermediate point potential, or the like, whereby a large number of practical advantages, such as enabling IGBT overcurrent detection to be carried out, are achieved.

DETAILED DESCRIPTION

Hereafter, referring to the drawings, a description will be given of a voltage generating circuit and overcurrent detecting circuit according to the various embodiments.

Figure 1:
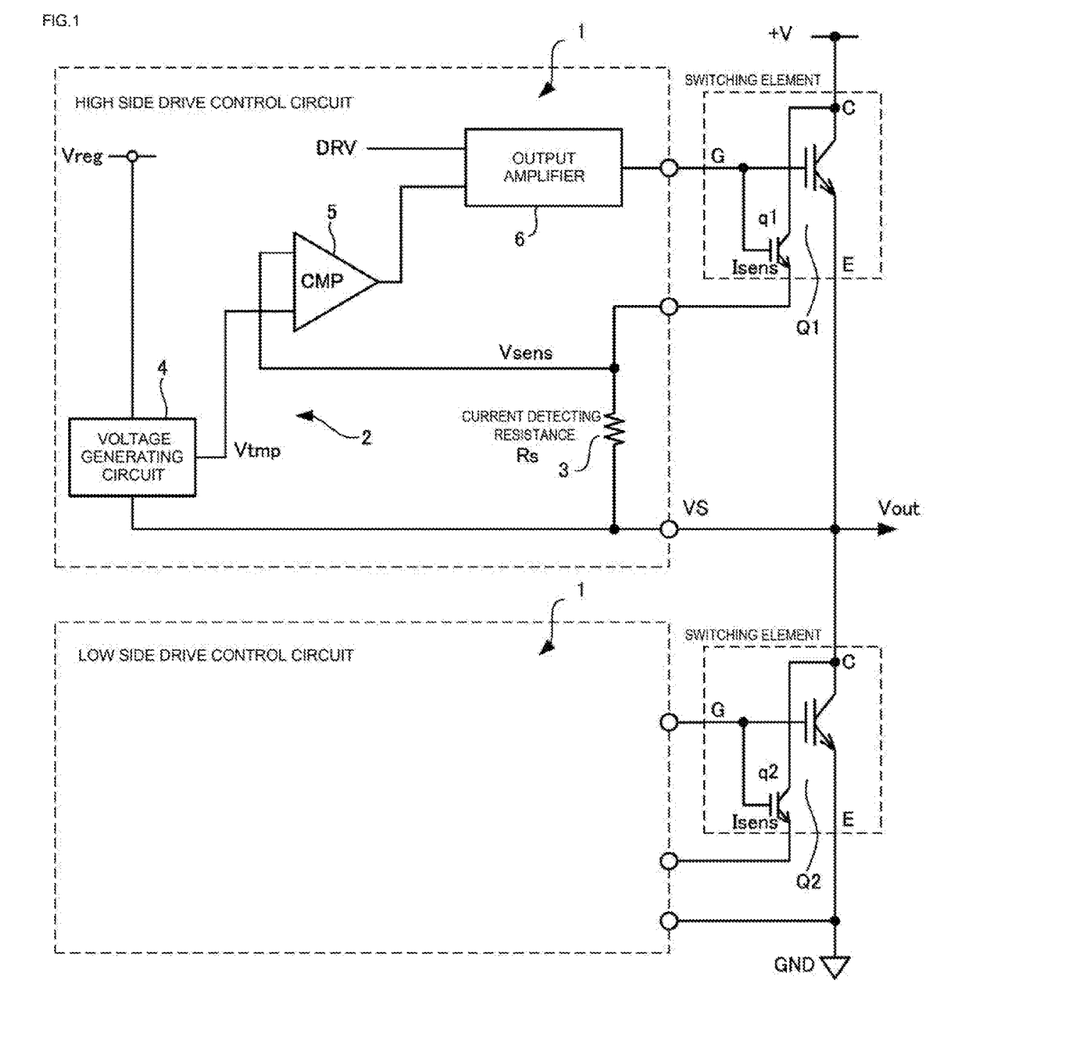
FIG. 1 is a diagram showing a main portion schematic configuration of an overcurrent detecting circuit according to an embodiment.

FIG. 1 is a main portion schematic configuration diagram of an overcurrent detecting circuit incorporated in a power converter. The power converter is configured to include, for example, two switching elements Q1 and Q2 connected in series to form a half-bridge circuit. The switching elements Q1 and Q2 switch a predetermined power supply voltage +V by being alternately driven on and off by a drive control circuit to be described hereafter, and output an alternating current voltage Vout to be supplied to an unshown load from an intermediate point of the half-bridge circuit. Herein, the switching elements Q1 and Q2 are formed of, for example, IGBTs with high breakdown voltage, but there are also cases in which MOSFETs with high breakdown voltage are used.

High side and low side drive control circuits 1, 1, which drive the switching elements Q1 and Q2 respectively on and off, are constructed to include a voltage generating circuit according to the embodiment. Herein, the high side drive control circuit 1 is configured so as to operate by receiving the power supply voltage +V, with an intermediate point voltage VS of the half-bridge circuit as a reference potential. Also, the low side drive control circuit 1 is configured so as to operate by receiving, for example, the intermediate point voltage VS of the half-bridge circuit, with a ground voltage GND as a reference potential.

Herein, a description will be given of the high side drive control circuit 1 that drives the switching element Q1 on the positive potential (+V) side of the half-bridge circuit on and off, but the low side drive control circuit 1 that drives the switching element Q2 on the negative potential (GND) side on and off is configured in the same way as the high side drive control circuit 1. Herein, the high side drive control circuit 1, for example, operates by receiving a predetermined power supply voltage Vreg, with the intermediate point voltage VS of the half-bridge circuit as a reference potential, while the low side drive control circuit 1 operates by receiving the intermediate point voltage VS, with the ground voltage GND as a reference potential.

Herein, an overcurrent detecting circuit 2, which detects an overcurrent flowing into the switching element Q1 (Q2) and causes the driving on of the switching element Q1 (Q2) to stop, is incorporated in the drive control circuit 1, as shown in FIG. 1. The overcurrent detecting circuit 2 performs a role of protecting the switching element Q1 (Q2) and the unshown alternating current load connected to the power converter from an overcurrent when the overcurrent is detected.

The overcurrent detecting circuit 2 includes current detecting resistance 3 that generates a voltage Vsens proportional to current flowing into the switching element Q1 (Q2) based on an output of a current detecting element q1 (q2) integrally incorporated in the switching element Q1 (Q2). Furthermore, the overcurrent detecting circuit 2 includes an overcurrent detecting comparator 5 that detects an overcurrent flowing into the switching element Q1 (Q2) by comparing the voltage Vsens detected via the current detecting resistance 3 and a comparison reference voltage Vtmp generated by a voltage generating circuit 4 to be described hereafter. The overcurrent detecting comparator 5 performs a role of stopping an operation of an output amplifier 6, which drives the switching element Q1 (Q2) on and off, when detecting an overcurrent.

The output amplifier 6 constantly receives a drive signal DRV supplied from an unshown control circuit, and drives the switching element Q1 (Q2) on and off. Also, when the switching element Q1 (Q2) is an IGBT, the current detecting element q1 (q2) is formed of a current sensing IGBT that is integrally incorporated in the IGBT, is mirror connected to the IGBT, and outputs a current Isens proportional to a current I flowing into the IGBT.

The voltage generating circuit 4 according to the embodiment performs a role of generating the comparison reference voltage Vtmp, which has temperature characteristics proportional to output temperature characteristics of the current detecting element q1 (q2). Although details will be described hereafter, the voltage generating circuit 4 according to the embodiment basically includes a first resistance voltage dividing circuit, which generates a reference voltage by resistance-dividing a predetermined power supply voltage (Vreg-VS or VS-GND) applied to the voltage generating circuit 4, a second resistance voltage dividing circuit, which generates a temperature-dependent divided voltage by resistance-dividing the power supply voltage Vreg, and an instrumentation amplifier that generates the comparison reference voltage Vtmp in accordance with a difference between the reference voltage and divided voltage. Furthermore, the voltage generating circuit 4 includes a comparator that determines whether or not a divided voltage exceeds a predetermined voltage threshold in accompaniment to a temperature rise, and is characterized by including a switch that is controlled by the comparator and changes divided voltage generated by the second resistance voltage dividing circuit and applied to the instrumentation amplifier, or a switch that is controlled by the comparator and changes a gain of the instrumentation amplifier.

Figure 2:
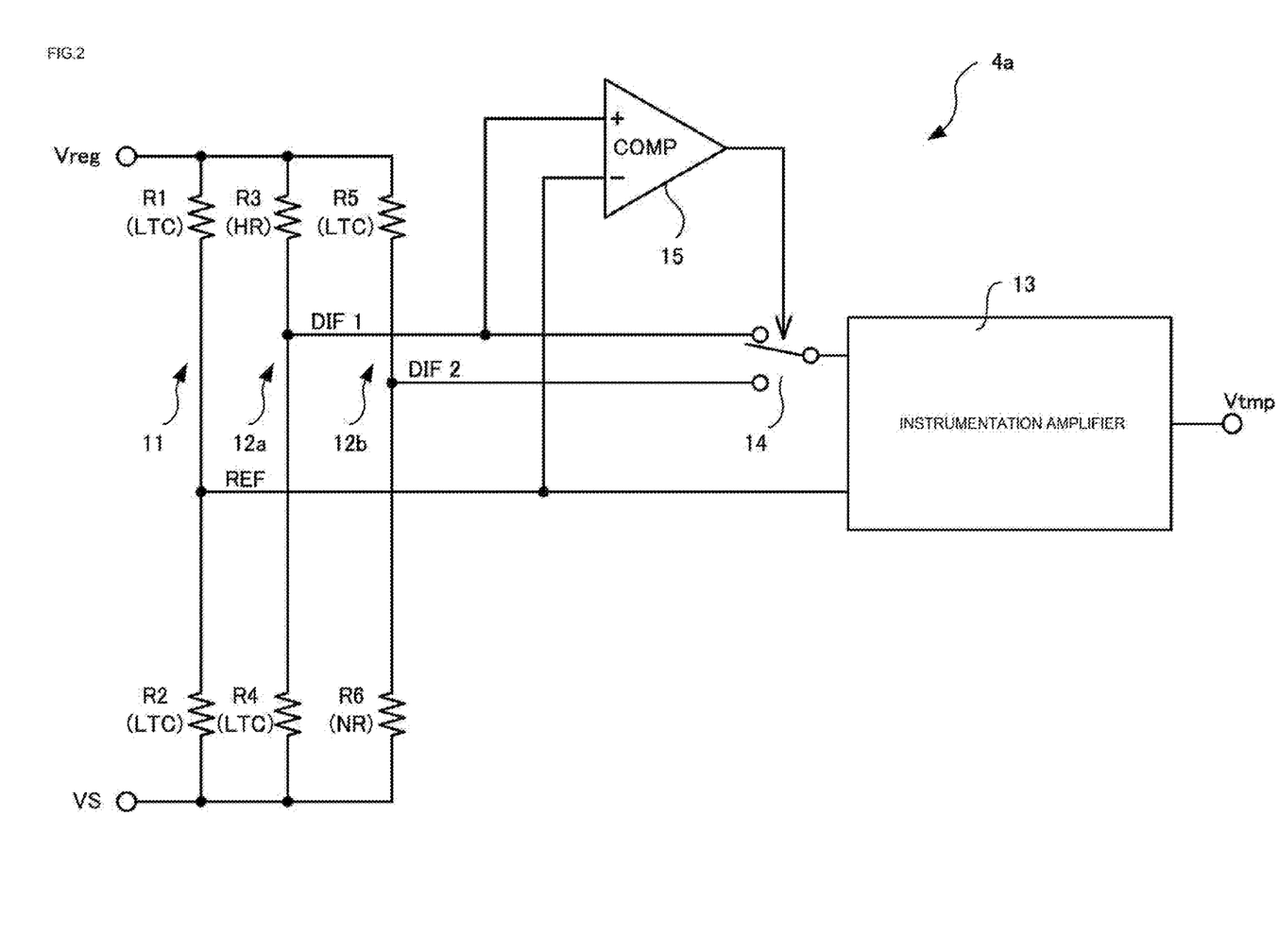
FIG. 2 is a diagram showing a schematic configuration of a voltage generating circuit according to a first embodiment.
Figure 3:
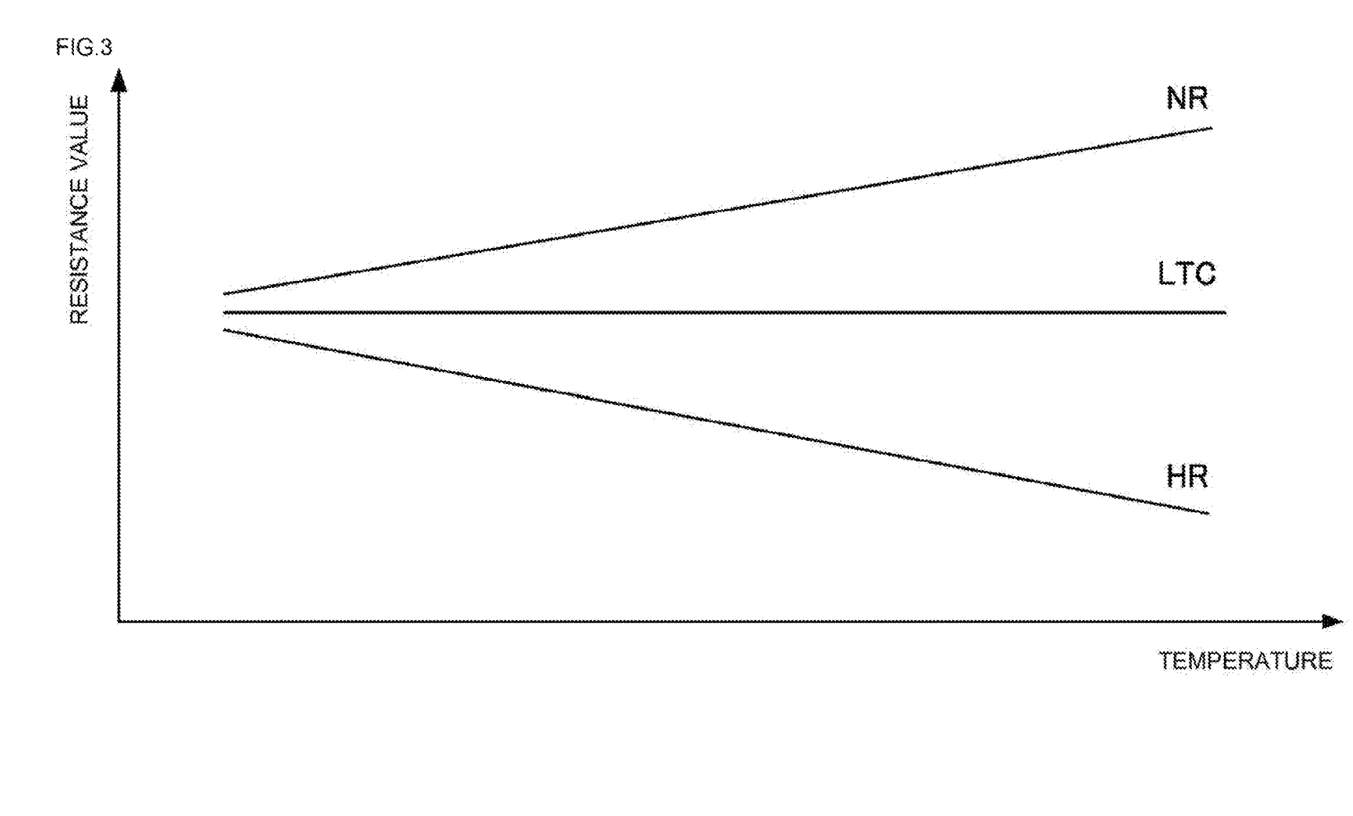
FIG. 3 is a diagram showing temperature characteristics of a low temperature coefficient resistor.

FIG. 2 shows a schematic configuration of a voltage generating circuit 4a according to a first embodiment. The voltage generating circuit 4a includes as a first resistance voltage dividing circuit 11 a series resistance circuit configured by two low temperature coefficient resistors (LTC) R1 and R2, whose temperature coefficient of resistance is equal to or about zero (0) as shown in FIG. 3, being connected in series. Also, the voltage generating circuit 4a includes a series resistance circuit configured by a general resistor (HR) R3 that has a negative temperature coefficient, as shown in FIG. 3, and a low temperature coefficient resistor (LTC) R4 being connected in series, and a series resistance circuit configured by a low temperature coefficient resistor (LTC) R5 and a resistor (NR) R6 that has a positive temperature coefficient being connected in series, as two second resistance voltage dividing circuits 12 (12a and 12b) provided in parallel. A resistor with a temperature coefficient of resistance "about zero" means that the resistance of the resistor remains substantially similar over an effective range of temperature for the resistor.

Herein, the low temperature coefficient resistors (LTC) and resistors having a negative or positive temperature coefficient (HR, NR) are all formed of polysilicon resistors formed by being simultaneously integrated on a semiconductor circuit element substrate on which the overcurrent detecting circuit 2 is constructed. The low temperature coefficient resistors (LTC) and resistors having a negative or positive temperature coefficient (HR, NR) are formed as resistors having mutually differing temperature coefficients by a kind of dopant to be ion-implanted in the semiconductor substrate in a semiconductor manufacturing process, and an amount of the dopant to be implanted, being individually selected. Herein, a specific method of manufacturing the low temperature coefficient resistors (LTC) and resistors having a negative or positive temperature coefficient (HR, NR) is as introduced in detail in, for example, Japanese Patent No. 4,547,753 and JP-A-2008-227061.

The previously described one second resistance voltage dividing circuit 12a is a series connection with the resistor (HR) R3 as the power supply voltage Vreg side and the low temperature coefficient resistor (LTC) R4 as a reference potential VS side. Also, the other second resistance voltage dividing circuit 12b is a series connection with the low temperature coefficient resistor (LTC) R5 as the power supply voltage Vreg side and the resistor (NR) R6 as the reference potential VS side.

Consequently, the first resistance voltage dividing circuit 11 generates a reference voltage REF that does not depend on temperature change by resistance-dividing the power supply voltage Vreg using the low temperature coefficient resistors (LTC). Also, the second resistance voltage dividing circuits 12a and 12b respectively generate divided voltages DIF1 and DIF2, whose temperature gradients mutually differ and whose potentials increase in accompaniment to a temperature rise, by resistance-dividing the power supply voltage Vreg using the resistor (HR, NR) having the previously described negative or positive temperature gradient and the low temperature coefficient resistor (LTC).

Herein, the temperature gradient of the divided voltage DIF1 generated by the second resistance voltage dividing circuit 12a is set to correspond to the output temperature characteristics of the current detecting element q1 when the temperature of the current detecting element q1 is low. Also, the temperature gradient of the divided voltage DIF2 generated by the second resistance voltage dividing circuit 12b, being greater than the temperature gradient of the divided voltage DIF1, is set to correspond to the output temperature characteristics of the current detecting element q1 when the temperature of the current detecting element q1 is high. The voltage dividing ratio of the second resistance voltage dividing circuits 12a and 12b is set so that the divided voltages DIF1 and DIF2 are equal to each other at a temperature threshold to be described hereafter.

Furthermore, the voltage generating circuit 4a includes a switch 14 that selects either the divided voltage DIF1 or DIF2 and applies the divided voltage DIF1 or DIF2 to an instrumentation amplifier 13, and a comparator 15 that controls an operation by the switch 14 of selecting the divided voltage DIF1 or DIF2. The instrumentation amplifier 13 performs a role of generating the comparison reference voltage Vtmp to be applied to the previously described overcurrent detecting comparator 5 in the overcurrent detecting circuit 2 in accordance with a difference between the reference voltage REF output from the first resistance voltage dividing circuit 11 and one of the divided voltages DIF1 and DIF2 selected by the switch 14.

Also, the comparator 15 determines a level of the divided voltage DIF1 output from the second resistance voltage dividing circuit 12a, with the reference voltage REF output from the first resistance voltage dividing circuit 11 as a reference. The comparator 15 performs a role of determining whether or not the temperature indicated by the divided voltage DIF1 exceeds a temperature threshold specified by the reference voltage REF generated by the first resistance voltage dividing circuit 11. Further, when the divided voltage DIF1 is lower than the reference voltage REF, because of which the temperature of the current detecting element q1 is lower than the temperature threshold, the switch 14 controlled by the comparator 15 selects the divided voltage DIF1, and applies the divided voltage DIF1 to the instrumentation amplifier 13. As opposed to this, when the divided voltage DIF1 is higher than the reference voltage REF, and the temperature of the current detecting element q1 exceeds the temperature threshold, the switch 14 selects the divided voltage DIF2, and applies the divided voltage DIF2 to the instrumentation amplifier 13.

Figure 4:
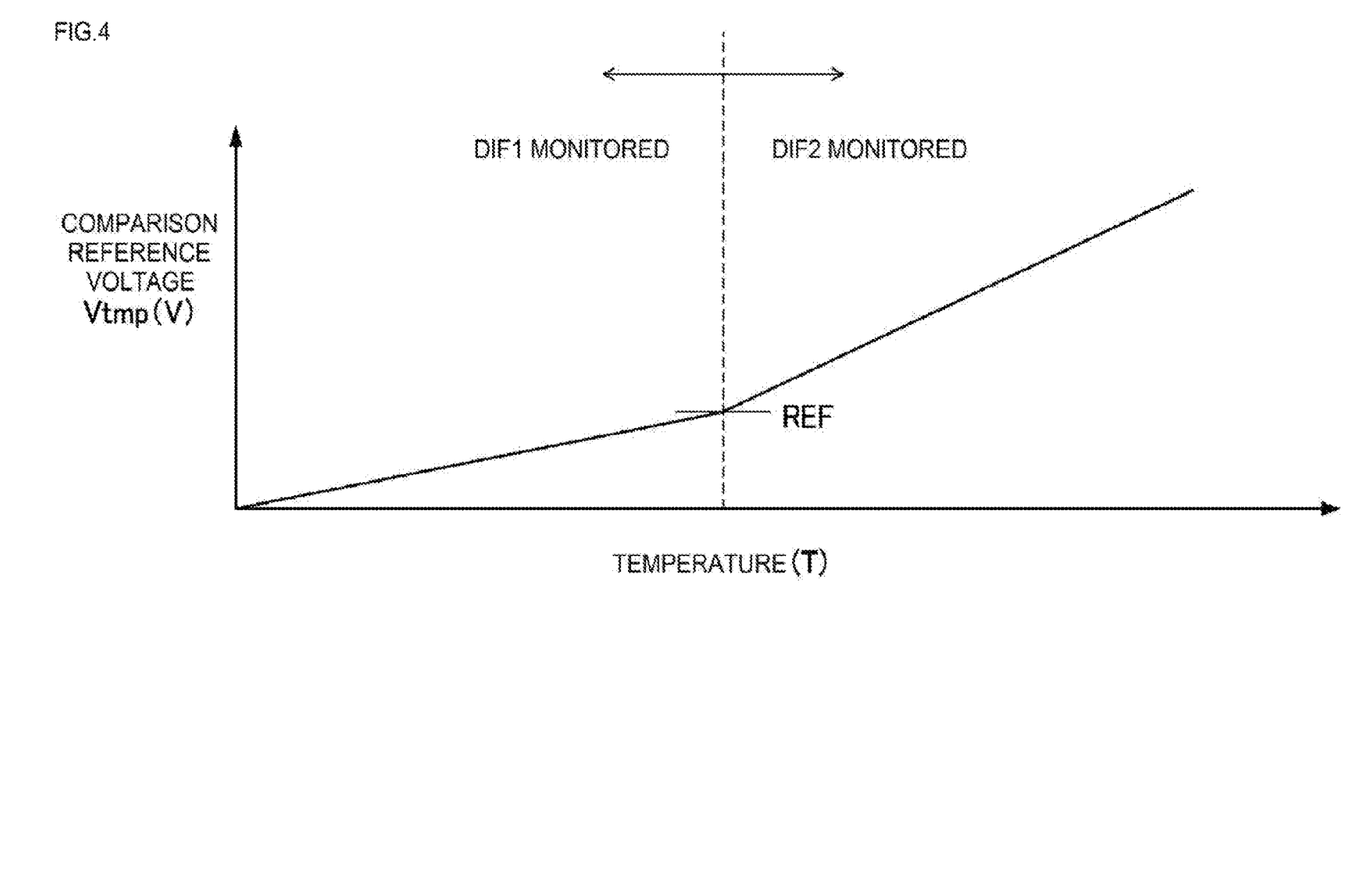
FIG. 4 is a diagram showing temperature characteristics of a comparison reference voltage generated by the voltage generating circuit shown in FIG. 2.

As a result of this, the instrumentation amplifier 13 generates the comparison reference voltage Vtmp in accordance with the difference between the reference voltage REF and divided voltage DIF1 when the temperature of the current detecting element q1 is lower than the temperature threshold, and generates the comparison reference voltage Vtmp in accordance with the difference between the reference voltage REF and divided voltage DIF2 when the temperature of the current detecting element q1 is higher than the temperature threshold. Consequently, the temperature gradient of the comparison reference voltage Vtmp output by the instrumentation amplifier 13 is changed in accordance with the output of the comparator 15, with the temperature threshold as a boundary, as shown in FIG. 4.

Specifically, the comparison reference voltage Vtmp is generated with temperature characteristics having a low temperature gradient with respect to temperature change when the temperature is low, and the comparison reference voltage Vtmp is generated with temperature characteristics having a high temperature gradient with respect to temperature change when the temperature is high. Consequently, the temperature characteristics of the comparison reference voltage Vtmp generated with a temperature gradient that changes before and after the temperature threshold in this way approximate non-linear output temperature characteristics of the current detecting element q1 with a higher accuracy than those of a comparison reference voltage generated by linearly approximating output temperature characteristics of the current detecting element q1 using the method disclosed in PTL 2.

As a result of this, according to the overcurrent detecting circuit 2 that carries out overcurrent detection using the comparison reference voltage Vtmp generated by the voltage generating circuit 4a configured as heretofore described, an overcurrent flowing into the switching element Q1 can be detected with high accuracy, regardless of the temperature of the current detecting element q1. Moreover, the voltage generating circuit 4a, as heretofore described, can be realized with a simple configuration such that the divided voltages DIF1 and DIF2 with differing temperature gradients generated by the second resistance voltage dividing circuits 12a and 12b respectively are selected, and applied to the instrumentation amplifier 13. Consequently, there are a large number of practical advantages.

Next, a voltage generating circuit 4b according to a second embodiment will be described. The voltage generating circuit 4b according to the second embodiment includes as the first resistance voltage dividing circuit 11 a series resistance circuit configured by the two low temperature coefficient resistors (LTC) R1 and R2, whose temperature coefficient of resistance can be taken to be zero (0), being connected in series, as shown in a schematic configuration in FIG. 5. Also, the voltage generating circuit 4b includes as the second resistance voltage dividing circuit 12 (12a) a series resistance circuit configured by the general resistor (HR) R3, which has a negative temperature coefficient, and the low temperature coefficient resistor (LTC) R4 being connected in series.

Figure 5:
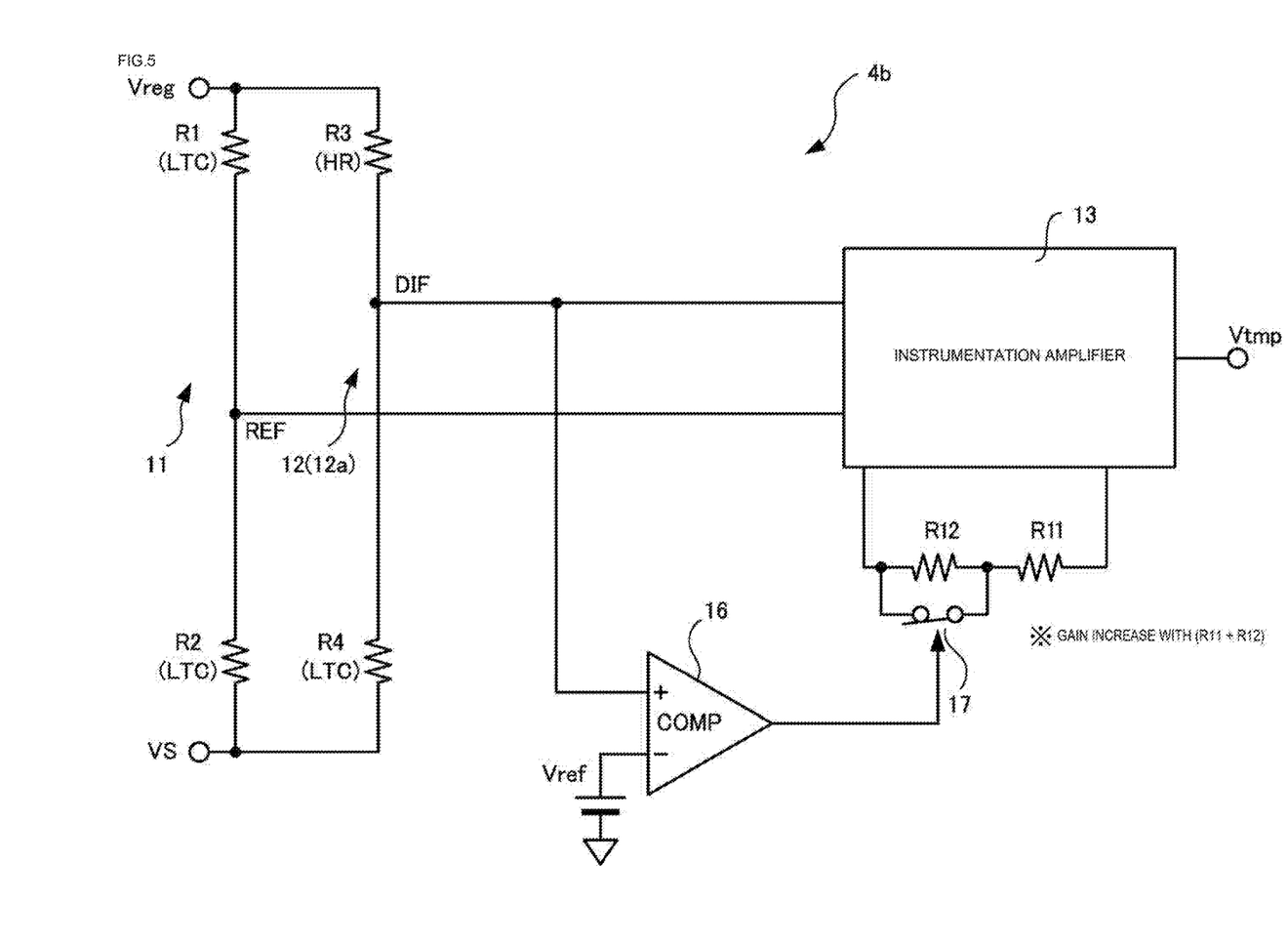
FIG. 5 is a diagram showing a schematic configuration of a voltage generating circuit according to a second embodiment.

Also, the voltage generating circuit 4b includes the instrumentation amplifier 13, which generates the comparison reference voltage Vtmp in accordance with the difference between the reference voltage REF, output by the first resistance voltage dividing circuit 11 after resistance-dividing the power supply voltage Vreg, and the divided voltage DIF output by the second resistance voltage dividing circuit 12 (12a) after resistance-dividing the power supply voltage Vreg. Furthermore, the voltage generating circuit 4b includes a comparator 16 that compares the divided voltage DIF with a threshold voltage Vref corresponding to a preset temperature threshold.

The comparator 16 performs a role of changing a gain (amplification factor) of the instrumentation amplifier 13 by variably setting gain adjusting resistance included in the instrumentation amplifier 13 when the divided voltage DIF exceeds the threshold voltage Vref. Specifically, two resistances R11 and R12 connected in series are provided as the gain adjusting resistance in the instrumentation amplifier 13. In particular, a switch 17 is provided in parallel with the resistance R12. The switch 17 reduces a resistance value with only the resistance R11 as the gain adjusting resistance by short-circuiting the resistance R12, whereby the gain of the instrumentation amplifier 13 is set low. Also, when the switch 17 is opened, the resistance value acting as the gain adjusting resistance is increased by the resistance R11 and resistance R12 being connected in series, whereby the gain of the instrumentation amplifier 13 is set high.

The comparator 16 performs a role of controlling the switch 17 so as to be turned on and off in accordance with the magnitude of the divided voltage DIF, in other words, in accordance with the temperature of the current detecting element q1 indicated by the divided voltage DIF. In particular, in this embodiment, the comparator 16 holds the switch 17 in an on-state (short-circuiting state) when the divided voltage DIF is lower than the threshold voltage Vref, and switches the switch 17 to an off-state (opened state) when the divided voltage DIF exceeds the threshold voltage Vref.

When the temperature of the current detecting element q1 is low owing to this kind of on/off control of the switch 17 by the comparator 16, the gain of the instrumentation amplifier 13 is kept low, and the temperature gradient of the comparison reference voltage Vtmp generated by the instrumentation amplifier 13 is kept small. Further, when the temperature of the current detecting element q1 exceeds the temperature threshold, the gain of the instrumentation amplifier 13 is set high, and the temperature gradient of the comparison reference voltage Vtmp generated by the instrumentation amplifier 13 is set to be large.

Therefore, according to the voltage generating circuit 4b configured in this way, the comparison reference voltage Vtmp can be generated with temperature characteristics having a low temperature gradient when the temperature of the current detecting element q1 is low, and the comparison reference voltage Vtmp can be generated with temperature characteristics having a high temperature gradient when the temperature of the current detecting element q1 is high, in the same way as in the voltage generating circuit 4a according to the previously described first embodiment. Consequently, the voltage generating circuit 4b is also such that the comparison reference voltage Vtmp can be generated with temperature characteristics wherein the temperature gradient changes before and after the temperature threshold. Therefore, the comparison reference voltage Vtmp wherein the non-linear output temperature characteristics of the current detecting element q1 are approximated can be generated with a higher accuracy than a comparison reference voltage generated using the method disclosed in the previously described PTL 2, and the accuracy of overcurrent detection in the overcurrent detecting circuit 2 can be increased.

Next, a voltage generating circuit 4c according to a third embodiment will be described. The voltage generating circuit 4c according to the third embodiment includes in parallel the series resistance circuit wherein the two low temperature coefficient resistors (LTC) R1 and R2 are connected in series and a series resistance circuit wherein two low temperature coefficient resistors (LTC) R7 and R8 are connected in series as first resistance voltage dividing circuits 11 (11a and 11b), as shown in a schematic configuration in FIG. 6. Also, the voltage generating circuit 4c includes the series resistance circuit wherein the resistor (HR) R3 that has a negative temperature coefficient and the low temperature coefficient resistor (LTC) R4 are connected in series, and the series resistance circuit wherein the low temperature coefficient resistor (LTC) R5 and the resistor (NR) R6 that has a negative temperature coefficient are connected in series, as two second resistance voltage dividing circuits 12 (12a and 12b) provided in parallel.

Figure 6:
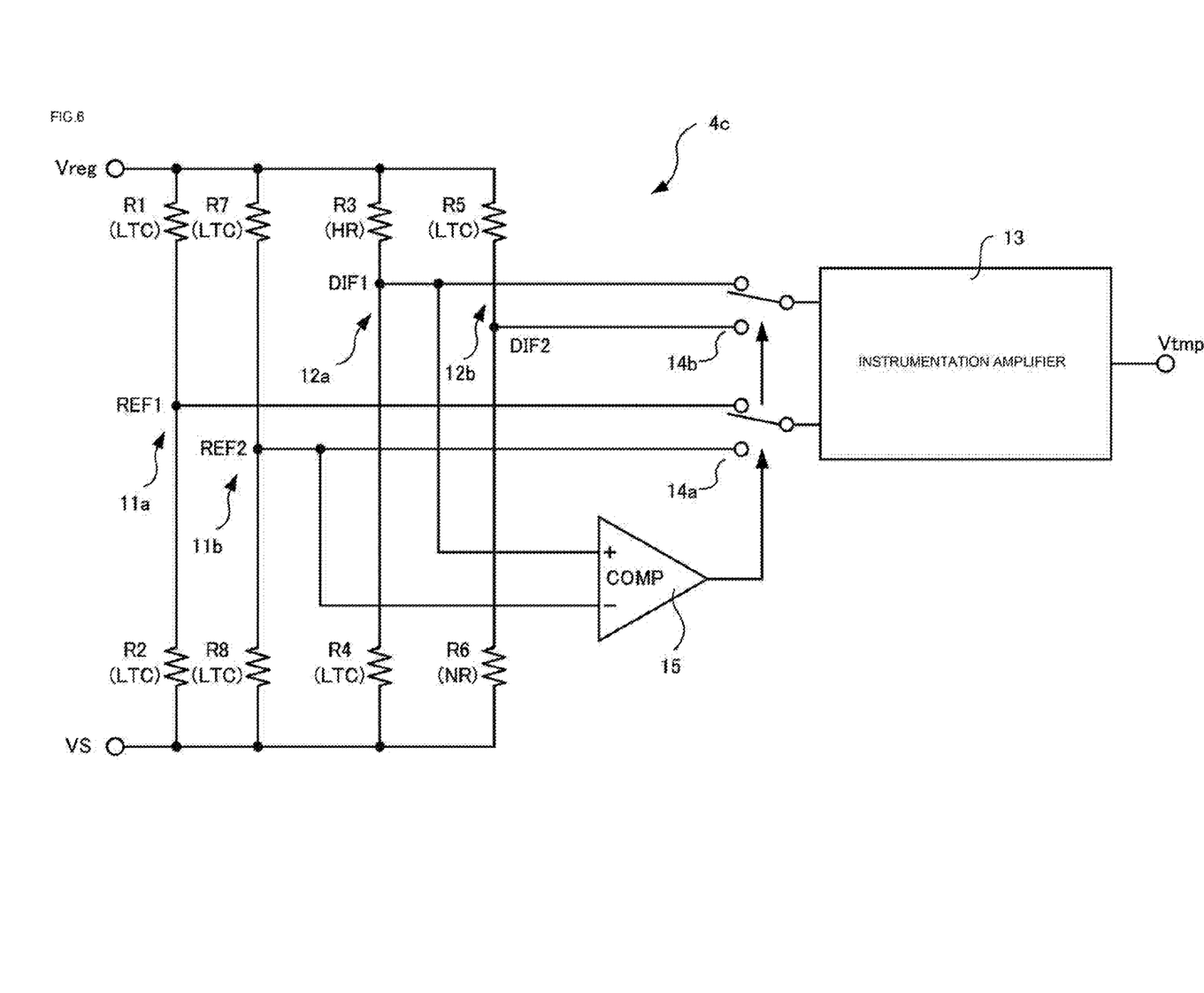
FIG. 6 is a diagram showing a schematic configuration of a voltage generating circuit according to a third embodiment.

The first resistance voltage dividing circuits 11 (11a and 11b) respectively generate two kinds of reference voltage REF1 and REF2 of mutually differing voltage dividing ratios and differing potentials, and the second resistance voltage dividing circuits 12 (12a and 12b) respectively generate the divided voltages DIF1 and DIF2 with temperature characteristics of mutually differing temperature gradients. The reference voltage REF2 output by the first resistance voltage dividing circuit 11b is fixed as a voltage corresponding to the previously described temperature threshold. Also, the divided voltage DIF2 output by the second resistance voltage dividing circuit 12b is set so as to be equivalent to the divided voltage DIF1 at the time the divided voltage DIF1 output by the second resistance voltage dividing circuit 12a becomes equivalent to the reference voltage REF2.

Also, the voltage generating circuit 4c includes the instrumentation amplifier 13, into which are input the reference voltages REF1 and REF2 alternatively selected via a switch 14a, and the divided voltages DIF1 and DIF2 alternatively selected via a switch 14b coordinated with the switch 14a. The instrumentation amplifier 13 generates the comparison reference voltage Vtmp in accordance with a difference between the reference voltage REF1 and divided voltage DIF1, or with a difference between the reference voltage REF2 and divided voltage DIF2.

Herein, the comparator 15 performs a role of determining the level of the divided voltage DIF1 with the reference voltage REF2 as a reference, and switching each of the switches 14a and 14b in accordance with the temperature of the current detecting element q1. In particular, in this embodiment, the comparator 15 operates so as to select the reference voltage REF1 and divided voltage DIF1 via the switches 14a and 14b respectively when the divided voltage DIF1 is lower than the threshold voltage REF2, and select the reference voltage REF2 and divided voltage DIF2 via the switches 14a and 14b respectively when the divided voltage DIF1 exceeds the threshold voltage REF1.

Consequently, when the temperature of the current detecting element q1 is low, the instrumentation amplifier 13 generates the comparison reference voltage Vtmp in accordance with the difference between the reference voltage REF1 and divided voltage DIF1, with the reference voltage REF1 as a reference. Further, when the temperature of the current detecting element q1 exceeds the temperature threshold, the instrumentation amplifier 13 generates the comparison reference voltage Vtmp in accordance with the difference between the reference voltage REF2 and divided voltage DIF2, with the reference voltage REF2 as a reference. In other words, the comparison reference voltage Vtmp generated in accordance with the difference between the reference voltage REF2 and divided voltage DIF2 is generated to be positively biased by an amount corresponding to the difference in the potentials of the reference voltage REF1 and reference voltage REF2.

As a result of this, the comparison reference voltage Vtmp generated by the instrumentation amplifier 13 has temperature characteristics such that the temperature gradient is switched at an operating point of the comparator 15, as shown in FIG. 4. That is, when the temperature of the current detecting element q1 is low, the temperature gradient of the comparison reference voltage Vtmp generated by the instrumentation amplifier 13 is kept small. Further, when the temperature of the current detecting element q1 exceeds the temperature threshold, the temperature gradient of the comparison reference voltage Vtmp generated by the instrumentation amplifier 13 is set to be large.

Consequently, according to the voltage generating circuit 4c configured in this way, the comparison reference voltage Vtmp can be generated with temperature characteristics wherein the temperature gradient changes before and after the temperature threshold, in the same way as in the voltage generating circuits 4a and 4b according to the previously described first and second embodiments. In particular, the comparison reference voltage Vtmp can be generated with temperature characteristics having a low temperature gradient when the temperature is low, and the comparison reference voltage Vtmp can be generated with temperature characteristics having a high temperature gradient when the temperature increases. Therefore, the voltage generating circuit 4c is also such that the comparison reference voltage Vtmp wherein the non-linear output temperature characteristics of the current detecting element q1 are approximated can be generated with a higher accuracy than a comparison reference voltage generated using the method disclosed in the previously described PTL 2, and the accuracy of overcurrent detection in the overcurrent detecting circuit 2 can be increased.

Figure 7:
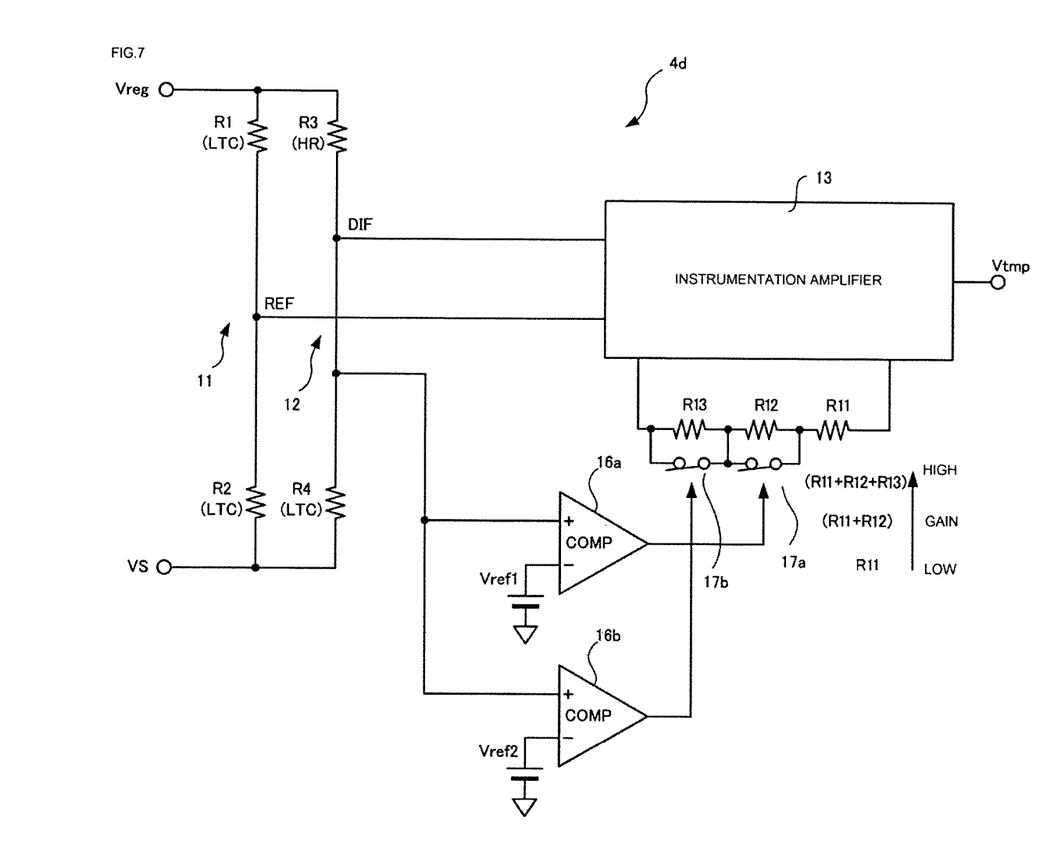
FIG. 7 is a diagram showing a schematic configuration of a voltage generating circuit according to a fourth embodiment.

Herein, the voltage generating circuits 4a, 4b, and 4c according to the heretofore described embodiments are such that the comparison reference voltage Vtmp is generated with the temperature gradient changed at one temperature threshold. However, the voltage generating circuit 4 can also be configured so that the temperature gradient of the comparison reference voltage Vtmp is changed at a multiple of temperature thresholds. FIG. 7 shows, as a fourth embodiment of the embodiment, a configuration example of a voltage generating circuit 4d such that the temperature gradient of the comparison reference voltage Vtmp is changed at a multiple of temperature thresholds.

That is, the voltage generating circuit 4d according to the fourth embodiment, in the same way as the voltage generating circuit 4b according to the previously described second embodiment, includes the series resistance circuit wherein the two low temperature coefficient resistors (LTC) R1 and R2 are connected in series as the first resistance voltage dividing circuit 11, and the series resistance circuit wherein the resistor (HR) R3 that has a negative temperature coefficient and the low temperature coefficient resistor (LTC) R4 are connected in series as the second resistance voltage dividing circuit 12, as shown in a schematic configuration in, for example, FIG. 7. Also, the voltage generating circuit 4d includes the instrumentation amplifier 13, which generates the comparison reference voltage Vtmp in accordance with the difference between the reference voltage REF output by the first resistance voltage dividing circuit 11 and the divided voltage DIF output by the second resistance voltage dividing circuit 12.

Furthermore, the voltage generating circuit 4d includes comparators 16a and 16b that respectively compare the divided voltage DIF with threshold voltages Vref1 and Vref2 corresponding to two preset temperature thresholds. The comparators 16a and 16b perform a role of changing the gain (amplification gain) of the instrumentation amplifier 13 at multiple stages by variably setting the gain adjusting resistance included in the instrumentation amplifier 13 when the divided voltage DIF exceeds the threshold voltages Vref1 and Vref2.

Specifically, three resistances R11, R12, and R13 connected in series are provided as the gain adjusting resistance in the instrumentation amplifier 13. Further, switches 17a and 17b for short-circuiting the resistances R12 and R13 respectively are provided on the resistances R12 and R13. The comparators 16a and 16b reduce the gain of the instrumentation amplifier 13 by turning on the switches 17a and 17b to reduce the gain adjusting resistance to only the resistance R11, and increase the gain of the instrumentation amplifier 13 by turning off only the switch 17a so that the gain adjusting resistance is the series circuit resistance of the resistances R11 and R12. Furthermore, the comparators 16a and 16b further increase the gain of the instrumentation amplifier 13 by turning off both the switches 17a and 17b so that the gain adjusting resistance is the series circuit resistance of the resistances R11, R12, and R13.

Figure 8:
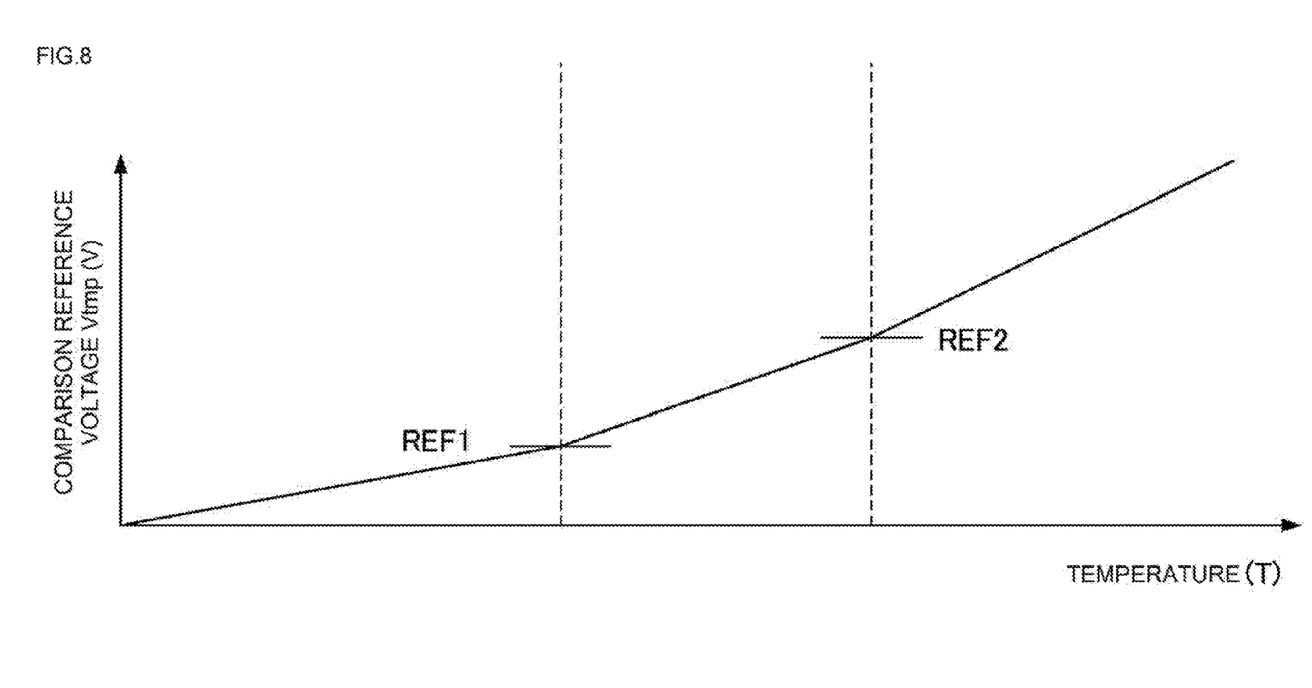
FIG. 8 is a diagram showing temperature characteristics of a comparison reference voltage generated by the voltage generating circuit shown in FIG. 7.

According to the voltage generating circuit 4d wherein the gain of the instrumentation amplifier 13 is variably set in three stages in this way, the temperature gradient of the comparison reference voltage Vtmp can be gradually increased in accordance with the temperature of the current detecting element q1, as shown in FIG. 8. Consequently, the comparison reference voltage Vtmp can be generated with temperature characteristics that approximate the non-linear output temperature characteristics of the current detecting element q1 with a higher accuracy than that shown in each of the previous embodiments. Therefore, according to the overcurrent detecting circuit 2 configured using the voltage generating circuit 4d, an advantage is achieved in that an overcurrent of the switching element Q1 can be detected with higher accuracy, and the like.

The embodiments are not limited to the heretofore described embodiments. For example, it is sufficient that whether to use the second resistance voltage dividing circuit 12a formed of the series resistance circuit wherein the resistor (HR) R3 that has a negative temperature coefficient and the low temperature coefficient resistor (LTC) R4 are connected in series, or whether to use the second resistance voltage dividing circuit 12b formed of the series resistance circuit wherein the low temperature coefficient resistor (LTC) R5 and the resistor (NR) R6 that has a positive temperature coefficient are connected in series, is determined in accordance with circuit specifications thereof. Also, a multiple of second resistance voltage dividing circuits 12 of mutually differing resistance voltage dividing characteristics can of course be formed using a multiple of resistors (HR) R3 that have negative temperature coefficients of differing temperature gradients, or using a multiple of resistors (NR) R6 that have positive temperature coefficients.

Furthermore, when generating the comparison reference voltage Vtmp with temperature characteristics having multiple stages of temperature gradient, alternative switching of inputting the previously described multiple of divided voltages DIF1, DIF2, and so on into the instrumentation amplifier 13, and changing the gain of the instrumentation amplifier 13, can of course be combined as appropriate. Furthermore, although the circuit configuration becomes somewhat complex, the temperature gradient of the comparison reference voltage Vtmp can be changed in four or more stages by employing the heretofore described method. Also, although the voltage generating circuit incorporated in the high side overcurrent detecting circuit 2 has been described here, the embodiment can also be applied in the same way to the voltage generating circuit incorporated in the low side overcurrent detecting circuit 2. In this case, VS is applied instead of Vreg, and GND is applied instead of VS, to the first resistance voltage dividing circuit 11 and second resistance voltage dividing circuit 12 in the circuits shown in FIG. 2, FIG. 5, FIG. 6, and FIG. 7. In addition to this, the embodiment can be modified in various ways without departing from the scope of the embodiment.

In this disclosure, wherever an element or component is discussed as performing or being caused to perform an operation or functionality, it shall be understood that such element or component may be configured to perform such operations or functionalities. Moreover, the aforementioned embodiments may be configured to cause or carry out any of the various operations or functionalities mentioned for the aforementioned embodiments. Elements or components may be configured to perform operations or functionalities by any suitable structural arrangements, including control structures external to the element or component.

Inclusion in this disclosure of any characterization of any product or method of the related art does not imply or admit that such characterization was known in the prior art or that such characterization would have been appreciated by one of ordinary skill in the art at the time a claimed invention was made, even if the product or method itself was known in the prior art at the time. For example, if a related art document discussed in this disclosure constitutes prior art, the inclusion of any characterization of the related art document does not imply or admit that such characterization of the related art document was known in the prior art or would have been appreciated by one of ordinary skill in the art at the time a claimed invention was made, especially if the characterization is not disclosed in the related art document itself.

Although a few embodiments have been shown and described, it would be appreciated by those skilled in the art that changes may be made in these embodiments without departing from the principles and spirit of the invention, the scope of which is defined in the claims and their equivalents.

Reference signs and numerals are as follows:
Q1, Q2 Switching element (IGBT)
q1, q2 Current detecting element (current sensing IGBT)
1 Drive control circuit
2 Overcurrent detecting circuit
3 Current detecting resistance
4, 4a, 4b, 4c, 4d Voltage generating circuit
5 Overcurrent detecting comparator
6 Output amplifier
11, 11a, 11b First resistance voltage dividing circuit
12, 12a, 12b Second resistance voltage dividing circuit
13 Instrumentation amplifier
14, 14a, 14b, 17, 17a, 17b Switch
15, 16, 16a, 16b Comparator
LTC Low temperature coefficient resistor
HR Resistor that has a negative temperature coefficient
NR Resistor that has a positive temperature coefficient

What is claimed is:

1. A voltage generating circuit that generates a comparison reference voltage having temperature characteristics proportional to output temperature characteristics of a current detecting element, the voltage generating circuit comprising:
   a first resistance voltage dividing circuit, configured by at least two low temperature coefficient (LTC) resistors connected in series, the at least two LTC resistors have resistance temperature coefficients equal to or about zero, the first resistance voltage dividing circuit generates a reference voltage by resistance-dividing a power supply voltage;
   at least two second resistance voltage dividing circuits, each of the second resistance voltage dividing circuits of the at least two second resistance voltage dividing circuits being configured by a resistor having a positive or negative resistance temperature coefficient and a third LTC resistor connected in series, each of the second resistance voltage dividing circuits of the at least two second resistance voltage dividing circuits generating a temperature-dependent divided voltage by resistance-dividing the power supply voltage;
   a comparator to compare the temperature-dependent divided voltage of a first of the at least two second resistance voltage dividing circuits to the reference voltage and to select as an output,
   the temperature-dependent divided voltage of the first of the at least two second resistance voltage diving circuits, when the temperature-dependent divided voltage of the first of the at least two second resistance voltage dividing circuits is less than the reference voltage, and
   the temperature-dependent divided voltage of a second of the at least two second resistance voltage dividing circuits, when the temperature-dependent divided voltage of the first of the at least two second resistance voltage dividing circuits is greater than the reference voltage; and
   an instrumentation amplifier that generates the comparison reference voltage based on a difference between the reference voltage and the output selected by the comparator.

2. The voltage generating circuit according to claim 1, wherein
   each of the at least two second resistance voltage dividing circuits is configured by,
   the resistor having the positive or negative resistance temperature coefficient has a negative resistance temperature coefficient and the third LTC resistor being connected in series with the resistor having the negative resistance temperature coefficient on a positive potential side of the power supply voltage, or,
   the resistor having the positive or negative resistance temperature coefficient has a positive resistance temperature coefficient and the third LTC resistor being connected in series with the resistor having the positive resistance temperature coefficient on a negative potential side of the power supply voltage.

3. The voltage generating circuit according to claim 1, wherein
   the at least two second resistance voltage dividing circuits comprise two second resistance voltage dividing circuits including a first circuit and a second circuit,
   the first circuit is configured by the third LTC resistor being connected in series with a resistor having a negative resistance temperature coefficient, as the resistor having the positive or negative resistance temperature coefficient for the first circuit, on a positive potential side of the power supply voltage, and
   the second circuit is configured by a fourth LTC resistor being connected in series with a resistor having a positive resistance temperature coefficient, as the resistor having the positive or negative resistance temperature coefficient for the second circuit, on a negative potential side of the power supply voltage.

4. The voltage generating circuit according to claim 1, wherein
   the at least two second resistance voltage dividing circuits generate a plurality of divided voltages of differing temperature gradients, and
   the comparator
       selects a divided voltage with a smaller temperature gradient from among the differing temperature gradients, as the temperature-dependent divided voltage, from the plurality of divided voltages at a time of normal temperature and applies the selected divided voltage to the instrumentation amplifier, and
       when the divided voltage with the smaller temperature gradient exceeds the reference voltage, selects a divided voltage with a larger temperature gradient than the smaller temperature gradient, as the at least one temperature-dependent divided voltage, and applies the selected divided voltage with the larger temperature gradient to the instrumentation amplifier.

5. The voltage generating circuit according to claim 1, wherein the at least two LTC resistors are formed of polysilicon formed by being simultaneously integrated on a semiconductor circuit element substrate on which the voltage generating circuit is constructed.

6. The voltage generating circuit according to claim 1, wherein
   the current detecting element is a current sensing IGBT integrally provided in a switching IGBT and mirror-connected to the switching IGBT, and
   the comparison reference voltage is used in a determination of a current detecting voltage proportional to an output current of the current sensing IGBT.

7. The voltage generating circuit according to claim 6, wherein
   the switching IGBT forms a half-bridge circuit and is a high side switching element in a power converter that switches the power supply voltage, and
   the first resistance voltage dividing circuit and the at least one second resistance voltage dividing circuit resistance-divide a difference between the power supply voltage and an intermediate point potential of the half-bridge circuit.

8. An overcurrent detecting circuit, provided in a drive control circuit that drives a switching element that switches input power on and off, that detects a current flowing into the switching element and controls an operation of the drive control circuit, the overcurrent detecting circuit comprising:
   a current detecting resistance that generates voltage proportional to a current flowing into the switching element based on an output of a current detecting element incorporated in the switching element;
   a voltage generating circuit according to claim 1 that generates the comparison reference voltage having temperature characteristics proportional to output temperature characteristics of the current detecting element; and
   an overcurrent detecting comparator that
      compares the comparison reference voltage generated by the voltage generating circuit and a voltage detected via the current detecting resistance, and
      detects an overcurrent flowing into the switching element.

9. The overcurrent detecting circuit according to claim 8, wherein
   the switching element is a high side switching element in a power converter including a pair of switching elements that are connected in series to form a half-bridge circuit, switch input power by being alternately driven on and off by a drive control circuit, and output alternating current voltage to be supplied to a load from an intermediate point of the half-bridge circuit, and
   the voltage generating circuit is incorporated in a high side drive control circuit that drives the high side switching element on and off.

10. A voltage generating circuit that generates a comparison reference voltage, the voltage generating circuit comprising:
   a first resistance voltage dividing circuit configured to generate a reference voltage by resistance-dividing a power supply voltage;
   a second resistance voltage dividing circuit configured to generate first and second temperature-dependent divided voltages by resistance-dividing the power supply voltage;
   a comparator that, in response to a change in the first temperature-dependent divided voltage in response to a temperature change, compares the first temperature-dependent divided voltage with the reference voltage and selects as an output,
      the first temperature-dependent divided voltage when the first temperature-dependent divided voltage is less than the reference voltage, and
      the second temperature-dependent divided voltage when the first temperature-dependent divided voltage is greater than the reference voltage; and
   an instrumentation amplifier that generates the comparison reference voltage based on the reference voltage and the output selected by the comparator.

11. A voltage generating circuit that generates a comparison reference voltage, the voltage generating circuit comprising:
   a first resistance voltage dividing circuit configured to generate a reference voltage by resistance-dividing a power supply voltage;
   a second resistance voltage dividing circuit configured to generate a first temperature-dependent divided voltage by resistance-dividing the power supply voltage;
   a third resistance voltage dividing circuit configured to generate a second temperature-dependent divided voltage by resistance-dividing the power supply voltage;
   a comparator that, in response to a change in the one of first temperature-dependent divided voltage or the second temperature-dependent divided voltage in response to a temperature change, compares the first temperature-dependent divided voltage with the reference voltage and selects as an output,
      the first temperature-dependent divided voltage when the first temperature-dependent divided voltage is less than the reference voltage, and
      the second temperature-dependent divided voltage when the first temperature-dependent divided voltage is greater than the reference voltage; and
   an instrumentation amplifier that generates the comparison reference voltage in accordance with the difference between the reference voltage and the output selected by the comparator.

* * * * *

UNITED STATES PATENT AND TRADEMARK OFFICE
CERTIFICATE OF CORRECTION

| | |
|---|---|
| PATENT NO. | : 10,281,941 B2 |
| APPLICATION NO. | : 15/830830 |
| DATED | : May 7, 2019 |
| INVENTOR(S) | : Takahiro Mori et al. |

Page 1 of 1

It is certified that error appears in the above-identified patent and that said Letters Patent is hereby corrected as shown below:

Column 13, Line 46:
In Claim 1, delete "diving" and insert -- dividing --, therefor.

Signed and Sealed this
Sixteenth Day of July, 2019

Andrei Iancu
*Director of the United States Patent and Trademark Office*